United States Patent [19]

Hasegawa et al.

[11] 4,363,065
[45] Dec. 7, 1982

[54] INTERPHASE UNBALANCE DETECTOR FOR AC LOAD CIRCUIT

[76] Inventors: Uohiko Hasegawa, 1-2, Torimi-cho 4-chome, Nara-shi, Nara 631; Yasuo Fujii, 1-20, Kunimi-cho 2-chome, Saidaiji, Nara-shi, Nara 631; Tahachi Murakami, 880-7, Shichijo Nishimachi, Nara-shi, Nara 630, all of Japan

[21] Appl. No.: 227,044
[22] PCT Filed: Feb. 8, 1979
[86] PCT No.: PCT/JP79/00027
 § 371 Date: Oct. 8, 1980
 § 102(e) Date: Sep. 25, 1980
[87] PCT Pub. No.: WO80/01742
 PCT Pub. Date: Aug. 21, 1980

[51] Int. Cl.³ .............................................. H02H 3/26
[52] U.S. Cl. ..................................... 361/85; 340/664; 361/87
[58] Field of Search ............... 361/85, 87, 90, 92; 340/658, 661, 664; 307/357

[56]  References Cited
U.S. PATENT DOCUMENTS 3,584,259  6/1971  Traub ................................. 361/85

FOREIGN PATENT DOCUMENTS 48-24311  7/1973  Japan .
48-44842  12/1973  Japan .
51-49059  12/1976  Japan .
549855  7/1977  U.S.S.R. .............................. 361/85

Primary Examiner—Harry E. Moose, Jr.
Attorney, Agent, or Firm—Armstrong, Nikaido, Marmelstein & Kubovcik

[57]  ABSTRACT

In polyphase AC load circuits, the current of each phase, which varies over a wide range, is led out to detect the unbalances of currents in the respective phases at arbitrarily adjustable predetermined unbalance factor by stationary-type device. The DC voltages ($E_U$ to $E_W$) corresponding to the currents in the respective phases are divided into forward constant-voltage elements ($D_1$ to $D_3$) and passive voltage varying elements ($VR_1$ to $VR_3$). The voltages at the elements ($VR_1$ to $VR_3$) are defined as current comparison voltages ($e_1$ to $e_3$), and the voltages ($E_U$ to $E_W$) in the respective phases are reduced by level adjusting circuits ($LA_1$ to $LA_3$) to reference level voltages ($e_U$ to $e_W$). Both voltages ($e_U$ to $e_W$) and ($e_1$ to $e_3$) are applied to the positive and negative terminals of the same elements ($D_4$ to $D_6$) to thus form an unbalance detecting circuit. When an unbalance occurs between two phases of the load circuit to cause the voltages ($e_1$ to $e_3$) to be lower than the voltages ($e_U$ to $e_W$) over the constant voltage of the elements ($D_4$ to $D_6$), relays ($RY_1$ to $RY_3$) are operated to break the circuit or to generate an alarm. The unbalance factor detecting sensitivity of this device is determined by the setting factor of the reference level voltages ($e_U$ to $e_W$) adjusted by the variable resistors ($R_1$ to $R_3$) in the adjusting circuits ($LA_1$ to $LA_3$).

5 Claims, 3 Drawing Figures

INTERPHASE UNBALANCE DETECTOR FOR AC LOAD CIRCUIT

BACKGROUND OF THE INVENTION

This invention relates to an interphase unbalance detector for AC load circuit intended to stabilize operation performance of loaded equipment, output torque for instance, by detecting the unbalance of load current of each phase when a polyphase Ac load such a three-phase induction motor is operated while controlling the supply voltage in a wide range throughout the whole area of the wide variation range at a constant rate of unbalance appropriate to the operational condition, and by cutting off the power or issuing alarm.

To keep unreeling speed of wire or film sheet(V:m/s) and winding tension(T:kg) respectively at a constant level, like in the case of winders in wire factories or roll driving units in film factories, the required output (KW) of such driving motors is obtained as a constant value of approximately $T \cdot V/102$, and to the motors of these applications, a constant output is required regardless of the variation in their rate of rotation. These three-phase induction motors are called variable-speed motors and the constrained torque(Tso) at the rated voltage(Es) i.e. the torque at zero rotation(N=0) is the maximum torque, the torque(Ts) becomes zero at a synchronized number of rotation(Ns), and the intermediate torque is indicated by a specific speed-torque characteristic. If this is applied to a winder taking about one half of an ordinary rated voltage(Es/2) as the starting voltage and (2/3 Ns) as the rated number of rotation to start, the motor rotation(N) goes down from (2/3 Ns) in proportion to the increase in the wire wound around the wire drum while the wire delivered from the drawing machine at a constant speed(V) is wound around the drum. This rate of reduction is so high as ⅓ normally and 1/10 maximum. If the starting voltage(Es/2) is kept as it is, accordingly, the winding torque(Tw) increases due to the characteristic as started above, excessive tension is applied to the wire, the wire is drawn and the outside diameter goes out of the standard. The conditions for stable production of high quality wires by preventing this, therefore, are the smoothness of wide range stepless control to reduce the primary voltage of the motor corresponding to the reduction in the rate of rotation, and the adequate mutual unbalance ratio of the three-phase voltage. The unbalance of three-phase voltage cuased by trouble in the power supply system or others is multiplied becoming the unbalance of motor current, which reduces the torque and results in detective products. If one of the three phases fails, the current of the other two phases is reduced resulting in a shortage of torque as described above and defective products are made. Phase failure or unbalanced current due to malcontact of a slip ring and brush shall be detected for treatment at an early time and by each phase, if possible, otherwise the slip ring and brush may be damaged.

As described above, mutual unbalance in the load circuit causes insufficient torque and affects the quality of products, and this is applicable not only to winders as mentioned above but also to many other types of industrial equipment such as tension control rollers or cylinder driving motors in chemical textile, plastics or film production. The relays that have been used generally for motors, however, are to prevent the burning of motors, and over-current relays, 2E, 3E and 4E relays that are actuated by the over-current of other phases due to phase failure including unbalanced current have been used to prevent phase failure. In the use of the variable speed motor as mentioned above, over-current relays and other device are naturally provided to prevent burning, but so far, no adequate unbalance detector to be used on top of the above over-current relays has been found, by which unbalanced current or phase failure as the cause for the insufficient torque is detected to stabilize product quality. The static type relay such as the above 3E, for instance, can not detect a low rate of unbalance lower than 35% of a current unbalance ratio. The invention of JP. B2, No. 51-49059 as the detector for load voltage variation and unbalance in a three-phase AC circuit reduces the allowable variation range of the supply voltage when an antiphase voltage is generated and is suitable to a contact load such as rated supply voltage, but this is not applicable to a variable load as mentioned above. The short current detector for the motor circuit of JP, Y2, No. 48-44842 is to detect a shortage when the motor current goes down below a predetermined level and responds only when the short current is substantial, reduction of more than 60% of the expected value for instance, and therefore, this is not suitable for the detection of an unbalance current of a low rate either. The over-current and unbalanced current relay of JP, B2, No. 48-24311 is similar to the above 3E relay and responds to the over-current at phase failure, but the sensitivity is low at balance condition, and therefore, is not suitable for the variable speed motor as described above that generates no over-current at phase failure.

A balance relay or differential relay has been used so far to compare two or more currents or voltages for detection of unbalance and to protect generators or transformers. Among such, the moving and shading coil type proportional differential relay with three terminals which has three inhibit coils and one operation coil can detect three-phase unbalance current when used with three current transformers. However, the disadvantage is that the rotation force of the rotor becomes faint with low current reducing the detection sensitivity and making it hard to judge the phase in trouble. Moreover, the structure is more complicated than static type and the service life is shorter. To detect interphase unbalance current of the above three-phases with a static type current balance relay, on the other hand, differential current of each phase shall be applied to the level detector, and therefore, an extra one set of current transformer and full-wave rectifier are required making the circuit and other structure more complicated, and such is not suitable as a practical detector. There is a high demand, not only in the above mentioned wire industry but also in many different fields of industry, for such detectors to detect interphase unbalance of load current varying in a wide range, particularly in the low current area, at any desired high sensitivity and to prevent shortage of output torque of motors in advance, not just to protect motors against burning.

This invention, therefore, is to provide an apparatus free from such disadvantages of a conventional unbalance detector or balance relay as described above, of simple circuit structure, with free setting of the detection sensitivity of an unbalance ratio corresponding to the condition of load circuit, with constant detection sensitivity in a wide variation range of load current. Further, the apparatus can ensure stable operation such as an even outside diameter of wire products wound up by a winder for instance, by detecting the unbalance of the load during operation by each phase exactly, and by cutting off the power or by giving out alarm.

BRIEF SUMMARY OF THE INVENTION

The apparatus of the present invention is so composed to convert the current of each phase once into DC voltage to detect interphase unbalance of the phase current in an AC load circuit, the DC voltage is divided into a constant voltage element with fixed forward conduction voltage such as P-N junction silicon diode and into a fixed or variable resistor as a variable voltage receiving element, terminal voltage of the resistor element is supplied to the output circuit provided as the phase current comparison voltage, while the DC voltage corresponding to phase current of respective adjacent phases is charged corresponding to the detection sensitivity of an unbalance ratio, which is taken as the reference level voltage for the level control circuit provided. The output terminal of this circuit and the above mentioned comparison voltage output terminal are connected to a diode of the same specification as the silicon diode as the constant voltage element, then a relay is actuated an amplifier to shut off the power or to give out an alarm when the difference in the output voltage of the above two reaches the forward constant voltage of the diode.

This is based on the principle that the diode of the level control circuit is conducted when the phase current at the side of the comparison voltage generation is lowered by unbalance becoming equal to the level voltage at the reference side since the diode of the above comparison voltage circuit is connected with the diode of the level control circuit, and therefore, the rate of setting of this level control circuit becomes equal to the detection sensitivity of the rate of interphase unbalance. This makes it possible to set the unbalance ratio detection sensitivity freely yet sensitively only by the setting ratio of the level control circuit with no regard to the intensity of the phase current or to the AC-DC conversion ratio. The minimum operation input of the amplifier that actuates the relay of this apparatus is equal to the constant voltage supplied by the silicon diode to the above level control circuit. The variable resistor of the comparison circuit also functions to balance the converted DC voltage when the current of the respective phases is balanced. Moreover, the thyristor and CR time constant circuit are provided to the operation current circuit of the relay function to set the operation time of the relay freely when unbalance is detected. Being composed as described above, the apparatus by the present invention is free from any disadvantage of conventional balance relays or unbalance detectors, allows free yet easy setting of the unbalance ratio detection sensitivity suitably to the required conditions such as the operational conditions of the load equipment, load current capacity, variation range of the phase current etc. as a static type detector of simple electronic circuit composition, and in addition, has the additional advantage of keeping the detection sensitivity at a constant level regardless of the variation in the phase current. By selecting the transformer corresponding to the load current capacity and when the comparison circuits corresponding to the number of phases are provided, this apparatus offers quite a universal application. Since the phase out of balance is detected exactly, the measures against the troubles of the slip ring or brush of motors can be taken promptly, and with such feature and many others, this invention will provide an apparatus quite effective to stabilize operation performance of polyphase AC load equipment and to keep even quality of products.

DETAILED DESCRIPTION OF THE INVENTION

Figure 1:
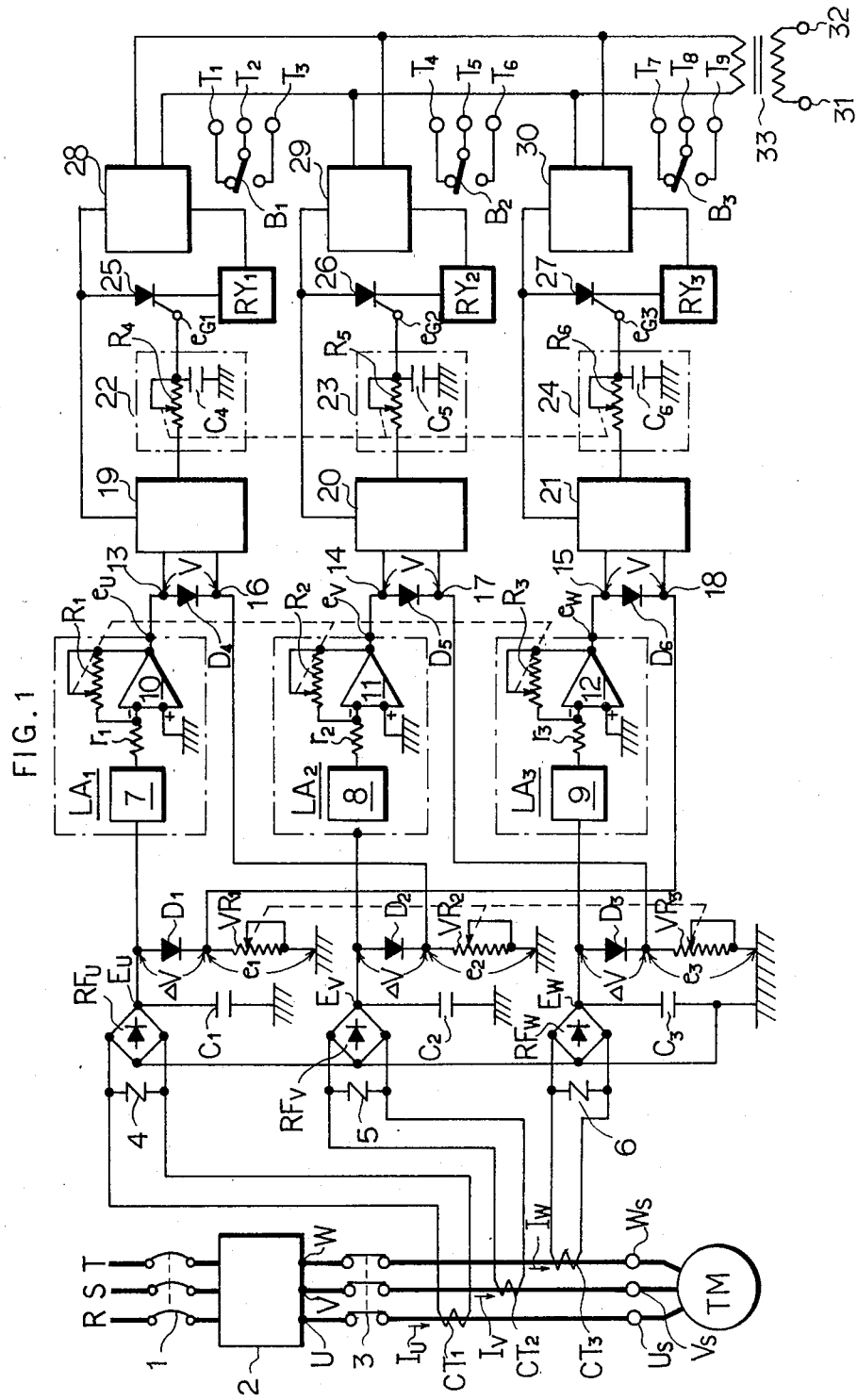
FIG. 1 shows the structure of an embodiment of this invention.

The present invention is now described in detail referring to the drawings attached. FIG. 1 is an outline structure of the interphase unbalance detector of a variable speed induction motor load circuit using a balanced three-phase AC power source. (R)(S) and (T) are the three-phase balanced AC circuit, (1) is the circuit breaker to cut off the circuit when grounding or interphase short-circuit occurs in the circuit or in the motor, (2) is the automatic or manual voltage regulator to control the supply voltage to the load and a sliding voltage regulator or induction voltage regulator is used. (3) is the electro-magnetic switch for load switching, and to the circuit of the remote controller of this switch (not illustrated), the terminals($T_1$)($T_2$), ($T_4$)($T_5$), ($T_7$)($T_8$) of the brake contacts($B_1$)($B_2$)($B_3$) of the relays($RY_1$)-($RY_2$)($RY_3$) of the detector of this embodiment are respectively connected. These terminals($T_1$)~($T_9$) are also connected to the circuit that actuates the external alarm device (lamp or others). To each one of the three-phases(U)(V)(W) at the output side of the voltage regulator(2), transformers ($CT_1$)($CT_2$($CT_3$) are inserted respectively. (Us)(Vs)(Ws) are slip rings and ($T_M$) is a variable speed induction motor. Protective devices such as the over-current relay to prevent burning of motor as described above and the cooling fan for the motor are ordinarily provided but these are not directly related to the present invention and are omitted in the illustration. The transformers ($CT_1$)($CT_2$($CT_3$) are inserted into the input side of the full-wave rectifiers($RF_U$)($RF_V$)($RF_W$) of which secondary windings are protected against over-voltage by the varistors (4)(5)(6). After being smoothed by the condenser ($C_1$)($C_2$)($C_3$), the output voltages($E_U$)($E_V$)($E_W$) of these three full-wave rectifiers are applied to the following two circuits. In one of the two circuits, the forward conduction voltage is divided into the constant voltage ($\Delta V$) of active elements with approximately constant voltage, for example P-N junction silicon diodes(or P-N junction germanium diodes) ($D_1$)($D_2$)($D_3$) and into the terminal voltages($e_1$)($e_2$)($e_3$) of the variable resistors($VR_1$)($VR_2$)($VR_3$) as the passive elements for voltage variation, and these terminal voltages ($e_1$)($e_2$)($e_3$) are used as the comparison voltage for each phase current. The other circuit is the level control circuit indicated by ($LA_1$)($LA_2$) and ($LA_3$). This level control circuit includes signal converters(7)(8)(9) and function arithmetic units(10)(11)(12), and functions to adjust the above voltages ($E_U$)($E_V$)($E_W$) to the level voltages($e_U$)-($e_V$)($e_W$) by the ratio($-K$) which is the quotient of the external variable resistance($R_1$) of the function arithmetic units divided by the input resistance ($r_1$). These resistance values($R_1$)($R_2$)($R_3$) are interlocked to each other for adjustment. Then the silicon diodes($D_4$)($D_5$)($D_6$) of the same standard respectively as the above ($D_1$)($D_2$)($D_3$) are inserted between the output terminal(13) of the level voltage($e_U$) and the output terminal(16) of the above comparison voltage($e_2$), between the output terminal(14) of the level voltage($e_V$) and the output terminal(17) of the comparison voltage($e_3$), and between the output terminal(15) of the level voltage($e_W$) and the output terminal(18) of the comparison voltage($e_1$). Both the positive and negative terminals of these diodes are connected to the difference detection and amplification unit of the blocks(19)(20)(21). The difference detection and amplification units of (19)(20)(21) are composed of amplifiers and transistors in an IC amplifier that functions when the difference between the above level voltage and comparison voltage exceeds the constant voltage of the above diodes($\Delta V$), 0.5 V for instance. After amplification, the output voltage is supplied as the input to the operation time setters of the blocks(22)(23)(24) composed of the condensers($C_4$)($C_5$)($C_6$). By controlling the variable resistors($R_4$)($R_5$)($R_6$) of this time setter interlocked to each other, the detection operation time at an unbalanced load current between each phase or at a phase failure can be set freely. When the thyristors(25)(26)(27) that use the outputs($e_{G1}$)($e_{G2}$)($e_{G3}$) of this time setter as their gate signal are conducting, the said relays($RY_1$)($RY_2$)($RY_3$) are actuated. The rectification smoothing units(28)(29)(30) having the AC power sources(31)(32) and transformer (33) in common are composed of a full-wave rectifier, condensers and constant voltage diodes and supply a DC constant voltage to the difference detection and amplification units(19)(20)(21) and also serve as the operation power source for the relays(-$RY_1$)($RY_2$)($RY_3$).

Figure 2:
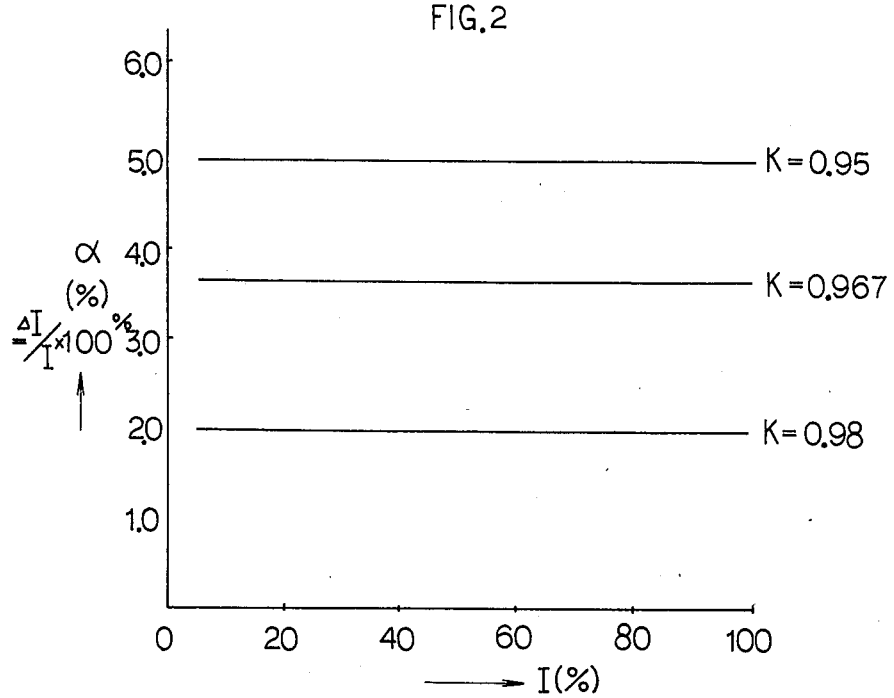
FIG. 2 shows the interphase unbalance ratio detection sensitivity performance of the same embodiment.

The structure of the apparatus is as described above, and the description of the operation goes as follows. To operate the motor($T_M$) of FIG. 1 while changing the load currents($I_U$)($I_V$)($I_W$), for example, from the maximum 30 A to about 10 A, the variable resistors($VR_1$)($VR_2$)($VR_3$) are first interlocked and adjusted so as the output voltages($E_U$)($E_V$)($E_W$) of the full-wave rectifiers($RF_U$)($RF_V$)($RF_W$) become a same voltage, 15.0 V for example, at the maximum current 30 A of each phase. If the AC convertion circuit has any intrinsic error, fine adjustment shall be made to each circuit. By limiting the description of operation now to the phase(U) and the phase(V), $E_U = E_V = 15.0$ V under balanced condition, and when the forward conduction constant voltage($\Delta V$) of silicon diodes($D_1$)($D_2$)-(hereinafter referred to as operation constant voltage) is equally 0.5 V the comparison voltage of the phase(V) is $e_2 = E_V - V = 14.5$ V, which is given to the output terminal(16). While the output voltage($E_U$) of the phase(U) is 15.0 as mentioned above, which is supplied to the level control circuit($LA_1$) as the input and is converted into $-15.0$ V by the signal converter (1). When the coefficient($-K$) set in the function arithmetic unit (10) is ($-0.98$) for example, the output, i.e. the level voltage is $e_U = +14.7$ V, which is given to the output terminal(13) of ($LA_1$). The above($-0.98$) is fixed by the ratio of $R_1/r_1$, and this is the setting ratio(K) of the level control circuit. The difference($\Delta V'$) between the outputs($e_2$) and ($e_U$) on the above output terminals(16) and (13) is 0.2 V and the operation constant voltage(V) of ($D_4$) is less than 0.5 V, hence ($D_4$) is not conducting and block (19) does not function. When the phase(V) is unbalanced to $I_V < I_U$, the comparison voltage($e_2$) of ($I_V$) comes down from 14.5 V to 14.2 V and $e''$ becomes equal to 0.3 V, then the difference($\Delta e$) with ($e_U$) becomes 0.5 V by $\Delta e' + \Delta e''$, the diode($D_4$) is conducted to actuate the block(19), thus the interphase unbalance is detected. The unbalance detection sensitivity ($\alpha\%$) is the ratio of the output voltage($E_V$) of the phase(V), i.e. 15 V, to the variation ($\Delta e''$), 0.3 V, of the above ($e_2$) i.e. $0.3/15.0 = 2\%$, and this is determined by the setting ratio(K)(0.98) of the above level control circuit. This is one of the features of the apparatus by this invention. Another principal feature is that the unbalance detection sensitivity($\alpha\%$) is constant as described below even if the current of each phase makes a substantial change due to the operation load. When, for example, both ($I_U$) and ($I_V$) are reduced from 30 A to 10 A, both of the output voltages ($E_U'$)($E_V'$) become 5.0 V. In this case, the level voltage of the phase(U) is $e_U' = 5.0$ V$\times 0.98 = 4.9$ V and reduces proportionally at ($\alpha\%$). The comparison voltage($e_2'$) of the phase(V), however, is $e_2' = 5.0$ V $-$ 0.5 V $= 4.5$ V since the operation constant voltage ($\Delta V$) of the diode($D_2$) does not change, accordingly the difference($\Delta e'$) is 0.4 V, and ($D_4$) is not conducted. ($D_4$) is conducted by the unbalance of $I_U' > I_V'$ only when ($e_2'$) goes down from 4.5 V to 4.4 V and the difference with ($e_U'$) reaches the operation voltage of ($D_4$), i.e. 0.5 V. This unbalance detection sensitivity($\alpha\%$) is the ratio of ($E_V'$) to the variation of ($e_2'$), as described above, i.e. 0.1 V/5 V $= 2\%$, and this is the same as the sensitivity at 30 A of the load current. In other words, unbalance can be detected at any desired sensitivity set by the level control circuit regardless of the current intensity of eacn phase. FIG. 2 is the graphic expression. For the abscissa, the rated current($I_{max}$) of each phase of the AC load circuit is taken as 100%, and this can be 30 A or 3 A depending on the load. The ordinate indicates the unbalance detection sensitivity($\alpha\%$), which is the ratio between the unbalance detection current($\alpha I$) and balance current(I) of each phase. (K) is the setting ratio of the above mentioned level control circuit that can be set at any desired ratio, and the cases of 0.98, 0.967 and 0.95 are shown as examples. Now going back to FIG. 1 again, the description of the interphase unbalance detection mechanism goes as follows. In the above comparison between the phase(U) and the phase(V), the phase(U) was normal while the phase(V) was abnormal (short current). Now the comparison between the phase(V) and the phase(W) can be detected when the phase(V) is normal and the phase(W) is abnormal(short current) by the function of the relay($RY_2$), and similarly the comparison between the phase(W) and the phase(U) is detected when the phase(W) is normal and the phase(U) is abnormal(short current) by the relay($RY_3$) respectively. The object is to detect the unbalance by short current of the next phase taking one phase as the reference. If for any reason, the reverse unbalance results from over-current, the phase(V) current becomes larger than the phase(U) current for example, the diode($D_4$) does not function, but if the phase(W) is normal at this time, ($I_V$) becomes larger than ($I_W$) and the diode($D_5$) functions, then the unbalance is detected by the relay($RY_2$). Unbalance is detected exactly by each phase in this manner.

Figure 3:
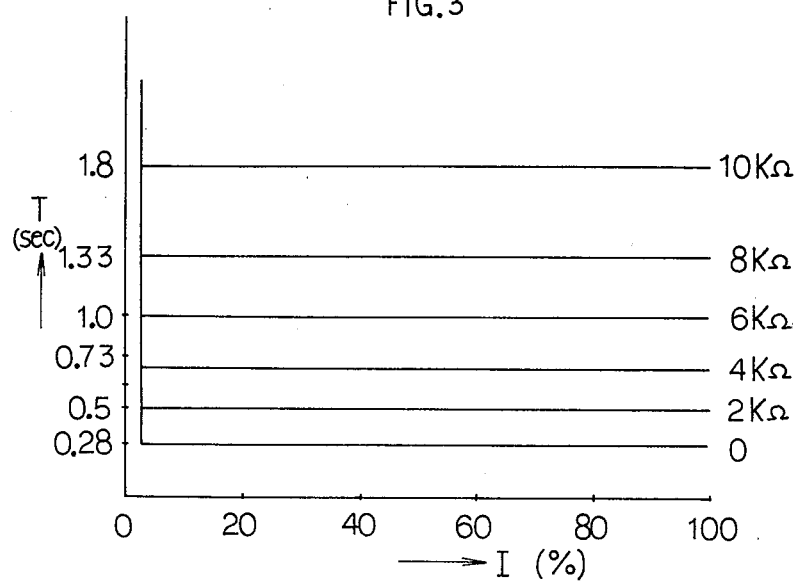
FIG. 3 shows the relay operation time performance curve under unbalanced condition of the same embodiment.

FIG. 3 is to explain the operation time setting device. This shows the performance of the operation time setting devices of the blocks(22)(23)(24) illustrated in FIG. 1. Like in the case of FIG. 2, the abscissa is for the variation range from 0 to 100% of each phase current and the ordinate indicates the time(sec) to the point where the relays($RY_1$)($RY_2$)($RY_3$) function when unbalance is detected. When the variable resistors($R_4$)($R_5$)($R_6$) within the setting device are adjusted in the range from 0 to 10KΩ, the operation time (T) changes within the range from 0.28 to 1.8 sec. as illustrated. Since the operation point is of the gate control system of the thyristors(25)(26)(27), the operation time can be set freely regardless of the intensity of phase current except for the nonsensitive band in low current area of about 3% of the rated current. Without saying, the operation time can also be set freely at any time outside of the above 0.28 ~1.8 sec by selecting CR. With this detector, the relay contacts are opened at an unbalanced condition or a phase failure and they are kept as being open, and the detector is provided with a reset circuit to reset the open contacts when all the troubles are removed and normal condition is restored. The reset circuit, however, is not illustrated as it is not associated directly with this invention. The connection of the relay contacts is not limited either to the arrangement as shown in FIG. 1, and plural number of contacts can be used freely, as a matter of course.

The invention is composed as described above, and for the comparison of phase current between two phases, two constant voltage elements with approximately constant forward conduction voltage such as P-N junction silicon diodes are connected, the DC voltage corresponding to the phase current of the reference phase is converted by the level control circuit, and the relays are so arranged to function when the difference between the DC voltage of the phase compared to the level voltage and the constant voltage of the constant voltage elements reaches the constant voltage. This arrangement makes it possible to set the detection sensitivity of the unbalance current simply by the setting ratio of the level control, gives the outstanding feature that the detection sensitivity is constant regardless of the variation in each phase current, and offers the convenience that the ratio to convert phase current into DC voltage and also the characteristic constant voltage of constant voltage elements can be selected freely.

Under the present situation that each phase current in the load circuit under temperature control of constant tension motors and electric furnaces popularly used for wire industry and many other fields of industry, the interphase unbalance detector according to this invention is suitable to prevent defective products due to slight unbalance between the phases which reduces the output torque and to ensure even quality of products.

What is claimed is:

1. A detector for detecting an interphase unbalance in a polyphase AC load circuit, including convertors for converting alternating current in respective phases of said polyphase AC load circuit into a DC voltage, and comparing-detecting means for comparing the DC voltage of one phase with the DC voltage of another phase and for detecting a deviation of the two voltages, the current of each phase being used to detect the unbalance of currents in the respective phases at an arbitrarily adjustable predetermined unbalance factor, said comparing-detecting means comprising a dividing circuit having a forward constant-voltage element and a passive voltage varying element, said DC voltage being applied to the respective elements, the voltage at the passive voltage varying element being defined as current comparison voltage; a level adjusting circuit which reduces the voltage to reference level voltage; and a second constant-voltage element having the current comparison voltage and the reference level voltage being applied to the positive and negative terminals thereof.

2. A detector according to claim 1, wherein said level adjusting circuit comprises an inverter and a function arithmetic means connected in series with the inverter at its input terminal and to said second element at its output terminal, said level adjusting circuit being connected in parallel with the dividing circuit.

3. A detector according to claim 2, said comparing-detecting means further comprises a relay, wherein when unbalance occurs between two phases of the load circuit to cause the current comparison voltage to be lower than the reference level voltage of the constant voltage of the second element, said relay is operated.

4. A detector according to any one of claims 2 or 3, wherein the passive voltage varying element of the dividing circuit is a variable resistor, whereby the comparison voltage is freely set.

5. A detector according to any one of claims 2 or 3, wherein the reducing rate is set by a variable resistor, and wherein the unbalance factor detecting sensitivity is determined by the setting factor of the reference level voltage adjusted by the resistor in the adjusting circuit.

* * * * *